United States Patent
Amikura et al.

(10) Patent No.: US 12,125,738 B2
(45) Date of Patent: Oct. 22, 2024

(54) STORAGE MODULE, SUBSTRATE PROCESSING SYSTEM, AND METHOD OF TRANSFERRING CONSUMABLE MEMBER

(71) Applicant: Tokyo Electron Limited, Tokyo (JP)

(72) Inventors: Norihiko Amikura, Miyagi (JP); Masatomo Kita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 616 days.

(21) Appl. No.: 17/351,294

(22) Filed: Jun. 18, 2021

(65) Prior Publication Data

US 2021/0398838 A1    Dec. 23, 2021

(30) Foreign Application Priority Data

Jun. 19, 2020    (JP) ................. 2020-106519

(51) Int. Cl.
*H01L 21/68*    (2006.01)
*H01L 21/60*    (2006.01)
*H01L 21/687*    (2006.01)

(52) U.S. Cl.
CPC ........ *H01L 21/68721* (2013.01); *H01L 21/60* (2021.08); *H01L 21/68742* (2013.01); *H01L 21/68764* (2013.01)

(58) Field of Classification Search
None
See application file for complete search history.

(56) References Cited

U.S. PATENT DOCUMENTS

| | | | | |
|---|---|---|---|---|
| 5,028,955 A  * | 7/1991 | Hayashida | .......... | G03F 7/70725 355/68 |
| 5,565,034 A  * | 10/1996 | Nanbu | .............. | H01L 21/67265 118/712 |
| 6,290,405 B1 * | 9/2001 | Ueda | ................. | H01L 21/67178 414/940 |
| 7,461,614 B2 * | 12/2008 | Fink | .................. | H01J 37/32633 118/723 ER |
| 7,622,006 B2 * | 11/2009 | Ishizawa | ........... | H01L 21/67745 414/217 |
| 8,010,221 B2 * | 8/2011 | Hontake | ........... | H01L 21/67051 700/121 |
| 8,342,119 B2 * | 1/2013 | Yudovsky | ............... | C30B 25/12 156/345.23 |
| 8,435,379 B2 * | 5/2013 | Mehta | ............... | H01L 21/02046 156/345.43 |

(Continued)

FOREIGN PATENT DOCUMENTS

| | | |
|---|---|---|
| JP | 2008-311391 A | 12/2008 |
| JP | 2012-216614 A | 11/2012 |
| JP | 2017-112337 A | 6/2017 |

*Primary Examiner* — Sylvia MacArthur
(74) *Attorney, Agent, or Firm* — XSENSUS LLP

(57) ABSTRACT

A storage module includes a substrate support, a sensor, a rotating unit, a storage unit and an elevating unit. The substrate support has a consumable member thereon. The sensor detects an orientation of the consumable member. The rotating unit rotates the consumable member in a predetermined direction based on the orientation of the consumable member detected by the sensor. The storage unit is disposed below the substrate support to store the consumable member. The elevating unit vertically moves the storage unit.

19 Claims, 9 Drawing Sheets

(56) References Cited

U.S. PATENT DOCUMENTS

| | | | |
|---|---|---|---|
| 8,781,787 B2* | 7/2014 | Hayashi | H01L 21/681 |
| | | | 700/214 |
| 10,424,502 B2* | 9/2019 | Matsunaga | H01L 21/68707 |
| 2015/0111944 A1 | 4/2015 | Renold et al. | |
| 2015/0176139 A1* | 6/2015 | Okamoto | H01L 21/6708 |
| | | | 156/345.17 |
| 2019/0355604 A1* | 11/2019 | Kawabe | H01L 21/67196 |
| 2021/0057246 A1* | 2/2021 | Bergantz | H01L 21/67356 |
| 2021/0398838 A1* | 12/2021 | Amikura | H01L 21/67748 |

* cited by examiner

STORAGE MODULE, SUBSTRATE PROCESSING SYSTEM, AND METHOD OF TRANSFERRING CONSUMABLE MEMBER

CROSS-REFERENCE TO RELATED APPLICATIONS

This application claims priority to Japanese Patent Application No. 2020-106519, filed on Jun. 19, 2020, the entire contents of which is incorporated herein by reference.

TECHNICAL FIELD

The present disclosure relates to a storage module, a substrate processing system, and a method of transferring a consumable member.

BACKGROUND

In a substrate processing system, a process module for processing a substrate is provided. In the process module, a consumable member such as an edge ring or a cover ring is consumed in a chamber as the substrate is processed. Therefore, it is required to replace the consumable member regularly. Conventionally, an operator opens the chamber of the process module and manually replaces the consumable member. However, the transfer of the consumable member using a transfer robot may also be considered. In this case, a storage unit for storing the consumable member and an alignment unit for performing positional alignment are required to align the consumable member.

As an example of an apparatus including the storage unit and the alignment unit, an apparatus for a wafer has been suggested. For example, there has been suggested a wafer alignment apparatus in which a wafer is extracted from a wafer container, transferred onto an adjacent mounting position, and rotated to set an orientation flat thereof in a certain direction (see, e.g., Japanese Patent Application Publication No. 2008-311391).

SUMMARY

The present disclosure provides a storage module, a substrate processing system, and a method of transferring a consumable member.

In accordance with an aspect of the present disclosure, there is provided a storage module including: a substrate support on which a consumable member is placed; a sensor configured to detect an orientation of the consumable member; a rotating unit configured to rotate the consumable member in a predetermined direction based on the orientation of the consumable member detected by the sensor; a storage unit disposed under or below the substrate support and configured to store the consumable member; and an elevating unit configured to vertically move the storage unit.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a storage module, a substrate processing system, and a method of transferring a consumable member of the present disclosure will be described in detail with reference to the accompanying drawings. The following embodiments are not intended to limit the present disclosure.

In order to transfer a consumable member to a transfer robot, a substrate processing system includes a storage module for storing and performing an alignment of the consumable member. In the storage module in which a storage unit and an alignment unit are installed adjacent to each other, a footprint becomes large because an installation space is required for each unit. However, in a factory where the substrate processing system is installed, it is required to reduce the footprint to improve space efficiency. Therefore, it is desired to reduce the footprint of the storage module.

First Embodiment

<Configuration of Substrate Processing System 1>

Figure 1:
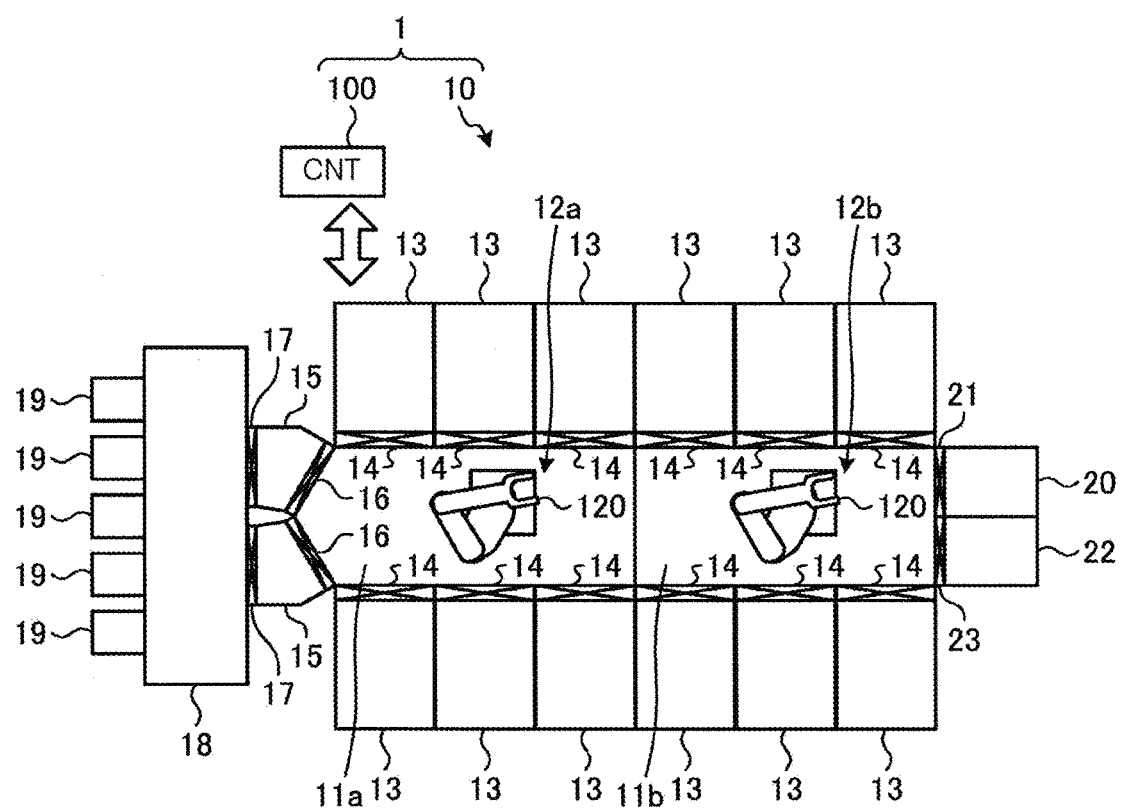
FIG. 1 is a horizontal cross-sectional plan view showing an example of a substrate processing system according to a first embodiment of the present disclosure.

FIG. 1 is a horizontal cross-sectional plan view showing an example of a substrate processing system according to a first embodiment of the present disclosure. The substrate processing system 1 shown in FIG. 1 is configured to process wafers individually and perform various treatments such as plasma processing and the like on each wafer (e.g., a semiconductor wafer).

The substrate processing system 1 includes a processing system body 10 and a controller (CNT) 100 for controlling the processing system body 10. As shown in FIG. 1, for example, the processing system body 10 includes vacuum transfer modules 11a and 11b, a plurality of process modules 13, a plurality of load-lock modules 15, an equipment front end module (EFEM) 18, an asking module 20, and a storage module 22. In the following description, each of the vacuum transfer modules 11a and 11b may also be referred to as "VTM," each of the process modules 13 may also be referred to as "PM," and each of the load-lock modules 15 may also be referred to as "LLM."

Each of the VTMs 11a and 11b has a substantially quadrangular shape in plan view. The PMs 13 are connected to two opposite side surfaces of each of the VTMs 11a and 11b. Further, to the other two opposite side surfaces, the LLMs 15 are connected to one of the two opposite side surfaces of the VTM 11a, and a path (not shown) to connect with the VTM 11b is connected to the other of the two opposite side surfaces. The angle between the side surfaces of the VTM 11*a* to which the LLMs 15 are connected is determined depending on the shapes of the two LLMs 15. The VTM 11*b* is connected to the VTM 11*a* through the path (not shown). The VTMs 11*a* and 11*b* have vacuum chambers where robot arms 12*a* and 12*b* are disposed, respectively.

The robot arms 12*a* and 12*b* are configured to be rotatable, extensible, contractible and vertically movable. Each of the robot arms 12*a* and 12*b* transfers a wafer between the PMs 13 and the LLMs 15 while holding the wafer on a fork 120 disposed at a tip end thereof. Further, each of the robot arms 12*a* and 12*b* transfers a consumable member between the PMs 13 and the storage module 22 while holding the consumable member such as an edge ring on the fork 120. The robot arms 12*a* and 12*b* are examples of a vacuum transfer robot. The robot arms 12*a* and 12*b* are not limited to those shown in FIG. 1 as long as they can transfer the wafer between the PMs 13 and the LLMs 15 and transfer the consumable member between the PMs 13 and the storage module 22.

Each PM 13 has a processing chamber where a cylindrical stage (substrate support) is disposed. After the wafer is placed on the stage, a pressure in the PM 13 is reduced and a processing gas is introduced. Then, a radio frequency power is applied into the PM 13 to generate plasma, and plasma processing is performed on the wafer by the plasma. The VTMs 11*a* and 11*b* are partitioned from the PMs 13 by gate valves 14. Disposed on the stage in the PM 13 are an edge ring that surrounds the wafer to improve the uniformity of the plasma processing and a cover ring for protecting an edge of the stage from the plasma. Further, an upper electrode for applying a radio frequency power is disposed at an upper portion of the processing chamber facing the stage.

The LLMs 15 are disposed between the VTM 11*a* and the EFEM 18. Each of the LLMs 15 has a chamber of which inner pressure can be switched between a vacuum state and an atmospheric pressure, and a cylindrical stage disposed therein. In the case of loading the wafer from the EFEM 18 into the VTM 11*a*, the wafer is transferred from the EFEM 18 into the LLM 15 maintained at an atmospheric pressure; the pressure in the LLM 15 is decreased; and the wafer is loaded into the VTM 11*a*. In the case of unloading the wafer from the VTM 11*a* into the EFEM 18, the wafer is transferred from the VTM 11*a* into the LLM 15 maintained in vacuum state; the pressure in the LLM 15 is increased to an atmospheric pressure; and the wafer W is loaded into the EFEM 18. The LLMs 15 are partitioned from the VTM 11*a* by gate valves 16. Further, the LLMs 15 are partitioned from the EFEM 18 by gate valves 17.

The EFEM 18 is disposed to be opposite to the VTM 11*a*. The EFEM 18 is a rectangular parallelepiped-shaped atmospheric transfer chamber having a fan filter unit (FFU) and maintained at an atmospheric pressure. The two LLMs 15 are connected to one long side of the EFEM 18. Five load ports (LP) 19 are connected to the other long side of the EFEM 18. A front opening unified pod (FOUP) (not shown) that is a container accommodating a plurality of wafers is placed on each LP 19. An atmospheric transfer robot (robot arm) for transferring a wafer is disposed in the EFEM 18. The EFEM 18 is an example of a loader module.

The ashing module 20 is connected to the VTM 11*b*. The ashing module 20 has a cylindrical stage therein. The ashing module 20 removes a resist of the wafer placed on the stage. The VTM 11*b* is partitioned from the ashing module 20 by a gate valve 21.

The storage module 22 is connected to the VTM 11*b*. The storage module 22 includes a storage unit for storing consumable members such as the edge ring, the cover ring, and the upper electrode. Further, the storage module 22 includes the stage (substrate support) and a rotating unit for aligning the consumable members. The storage module 22 can move the consumable member from the storage unit to the stage using the fork 120 of the robot arm 12*b*. The aligned consumable member is transferred to the PM 13 by the robot arm 12*b*. The VTM 11*b* is partitioned from the storage module 22 by a gate valve 23.

The substrate processing system 1 includes the controller 100. The controller 100 is, for example, a computer, and includes a central processing unit (CPU), a random access memory (RAM), a read only memory (ROM), an auxiliary storage device, and the like. The CPU operates based on a program stored in the ROM or the auxiliary storage device. The CPU controls operations of individual components of the substrate processing system 1.

(Details of Storage Module 22)

Figure 2:
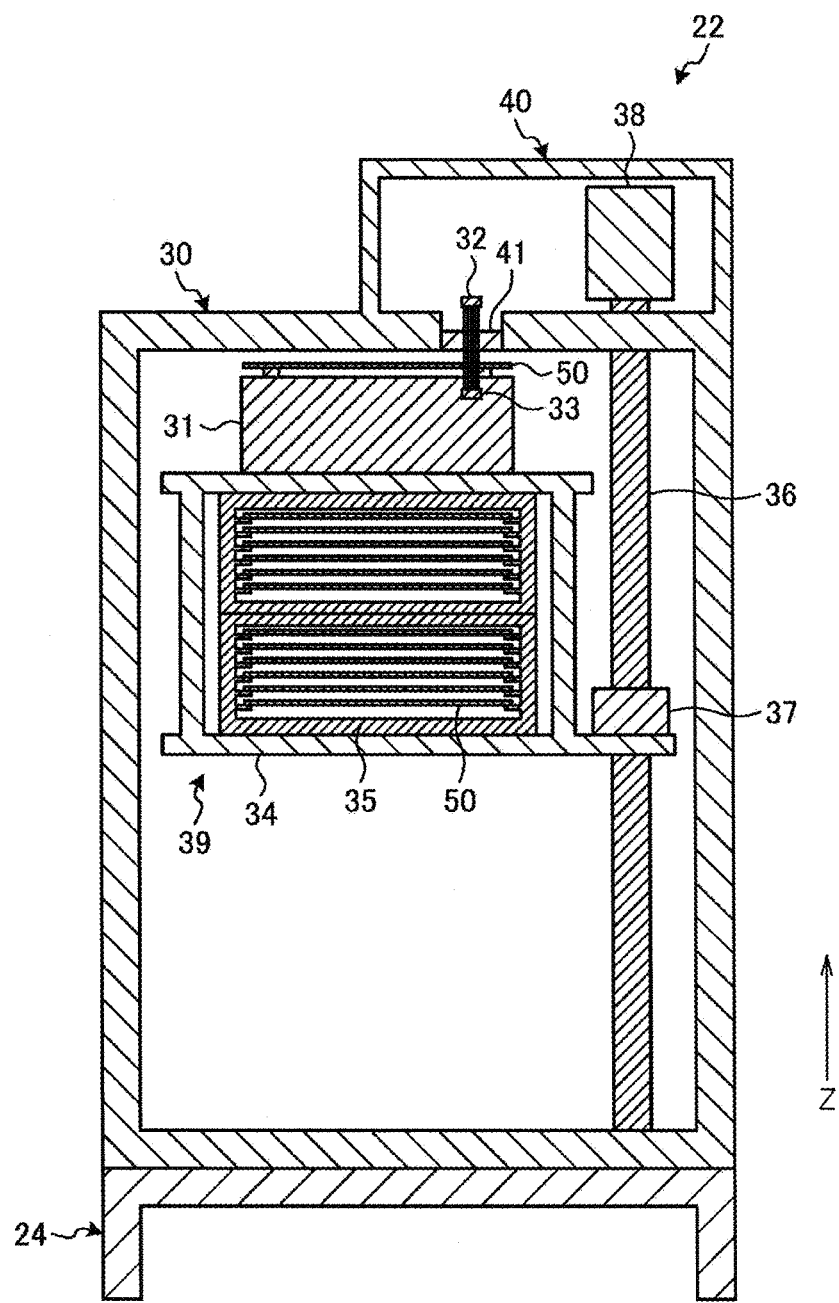
FIG. 2 is a cross-sectional front view showing an example of a storage module according to the first embodiment.

FIG. 2 is a cross-sectional front view showing an example of the storage module according to a first embodiment. FIG. 2 is a cross-sectional view of the storage module 22 viewed from the VTM 11*b* side. As shown in FIG. 2, the storage module 22 includes a chamber 30 disposed on a frame 24 and a machine room 40 disposed on the chamber 30. The pressure in the chamber 30 can be switched between a vacuum state and an atmospheric pressure. Further, $N_2$ gas is supplied as a purge gas to the chamber 30 to adjust the pressure in the chamber 30. The machine room 40 is maintained at an atmospheric pressure.

A storage 39 having a stage 31 and a case 34 disposed under the stage 31 is disposed in the chamber 30. The storage 39 can be raised and lowered by a ball screw 36. A line sensor 32 for detecting the orientation of the consumable member and a motor 38 for driving the ball screw 36 are installed in the machine room 40. A window 41 made of quartz or the like is disposed between the chamber 30 and the machine room 40 so that the line sensor 32 can receive light from a light emitting unit 33 to be described later.

The consumable member is placed on the stage 31. Further, the stage 31 has the light emitting unit 33 facing the line sensor 32. The stage 31 can be rotated in a θ1 direction by the rotating unit that is installed directly below a substrate support surface and configured to rotate the consumable member such as the edge ring 50 placed thereon in a predetermined direction. In other words, the stage 31 performs a positional alignment of the edge ring 50. The positional alignment is performed by setting the orientation flat (OF) of the edge ring 50 in a predetermined direction. Alternatively, the positional alignment may be performed by aligning a center position of the edge ring 50. The stage 31 is an example of the substrate support and the rotating unit. In the following description, the edge ring 50 will be described as an example of the consumable member.

The line sensor 32 detects the amount of light emitted from the light emitting unit 33 to be described later and outputs the detected amount of light to the controller 100. Based on the fact that the detected amount of light varies depending on whether or not the orientation flat of the edge ring 50 exists, the controller 100 detects the orientation flat of the edge ring 50. Based on the detection of the orientation flat, the controller 100 detects the orientation of the edge ring 50. The line sensor 32 is, for example, a line sensor of a charge coupled device (CCD), a complementary metal oxide semiconductor (CMOS), or the like.

The case 34 is disposed under the stage 31. A cassette 35 is stored in the case 34. The cassette 35 accommodates the edge ring 50 therein and can be extracted from the case 34.

The cassette 35 has the front side facing the storage module 22 that is opened and the rear side that is opened. The case 34 and the cassette 35 are examples of the storage unit.

The storage 39 includes a guide 37 supported by the ball screw 36 at a side surface thereof, in addition to the stage 31 and the case 34. The ball screw 36 connects an upper surface and a bottom surface of the chamber 30 and is connected to the motor 38 in the machine room 40 while penetrating through the upper surface of the chamber 30. A portion where the ball screw 36 penetrates through the upper surface of the chamber 30 is sealed such that the ball screw 36 is rotatable. The ball screw 36 can move the storage 39 in a vertical direction (Z-axis direction) while being rotated by the motor 38. The ball screw 36 and the motor 38 are examples of an elevating unit.

Figure 3:
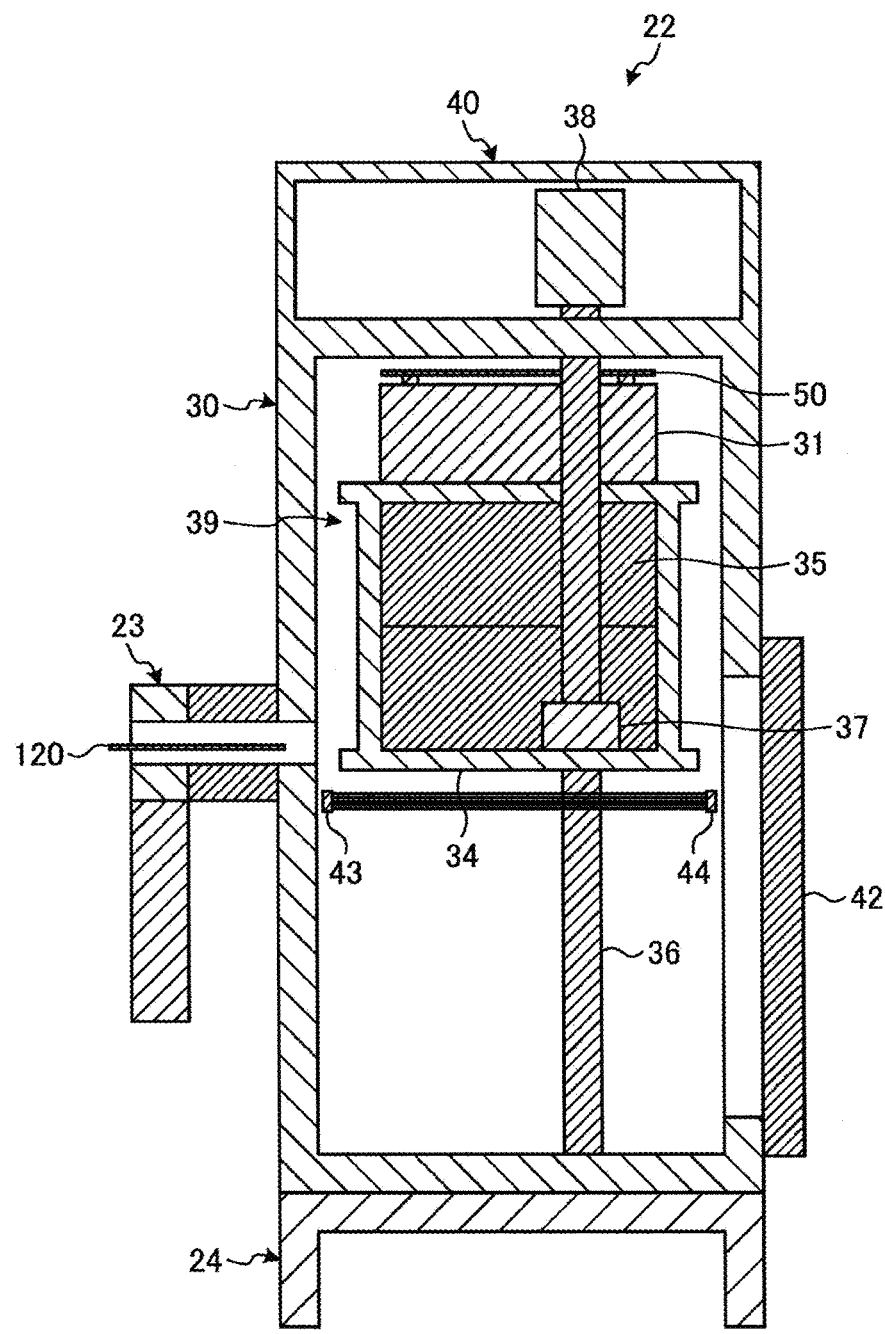
FIG. 3 is a cross-sectional side view showing the example of the storage module according to the first embodiment.

FIG. 3 is a cross-sectional side view showing an example of the storage module 22 in the first embodiment. FIG. 3 is a cross-sectional side view of the storage module 22 while the VTM 11b is disposed on the left side in FIG. 3. As shown in FIG. 3, the storage module 22 is connected to the VTM 11b through the gate valve 23. The fork 120 of the robot arm 12b of the VTM 11b can be inserted into the chamber 30 through the gate valve 23. The fork 120 loads and unloads the edge ring 50 placed thereon into and from the cassette 35. Further, the fork 120 places the edge ring 50 on the stage 31 and receives the edge ring 50 from the stage 31. A door 42 is opened and closed when the cassette 35 in the chamber 30 is extracted or installed.

The light emitting unit 43 and a sheet quantity detection sensor 44 detect the number of the edge rings 50 placed in the cassette 35 while the storage 39 moves the cassette 35 from the bottom surface side of the chamber 30 to an upper position facing the gate valve 23. The light emitting unit 43 is, for example, a light emitting diode (LED), a semiconductor laser, or the like. The sheet quantity detection sensor 44 detects the amount of light emitted from the light emitting unit 43 and outputs the detected amount of light to the controller 100. The controller 100 detects the number of edge rings 50 by measuring the number of times in which the light emitted from the light emitting unit 43 is blocked by the edge ring based on the detected amount of light. The sheet quantity detection sensor 44 is, for example, a photodiode, a phototransistor, or the like. Further, the sheet quantity detection sensor 44 may be, for example, a line sensor of a CCD, a CMOS, or the like.

Figure 4:
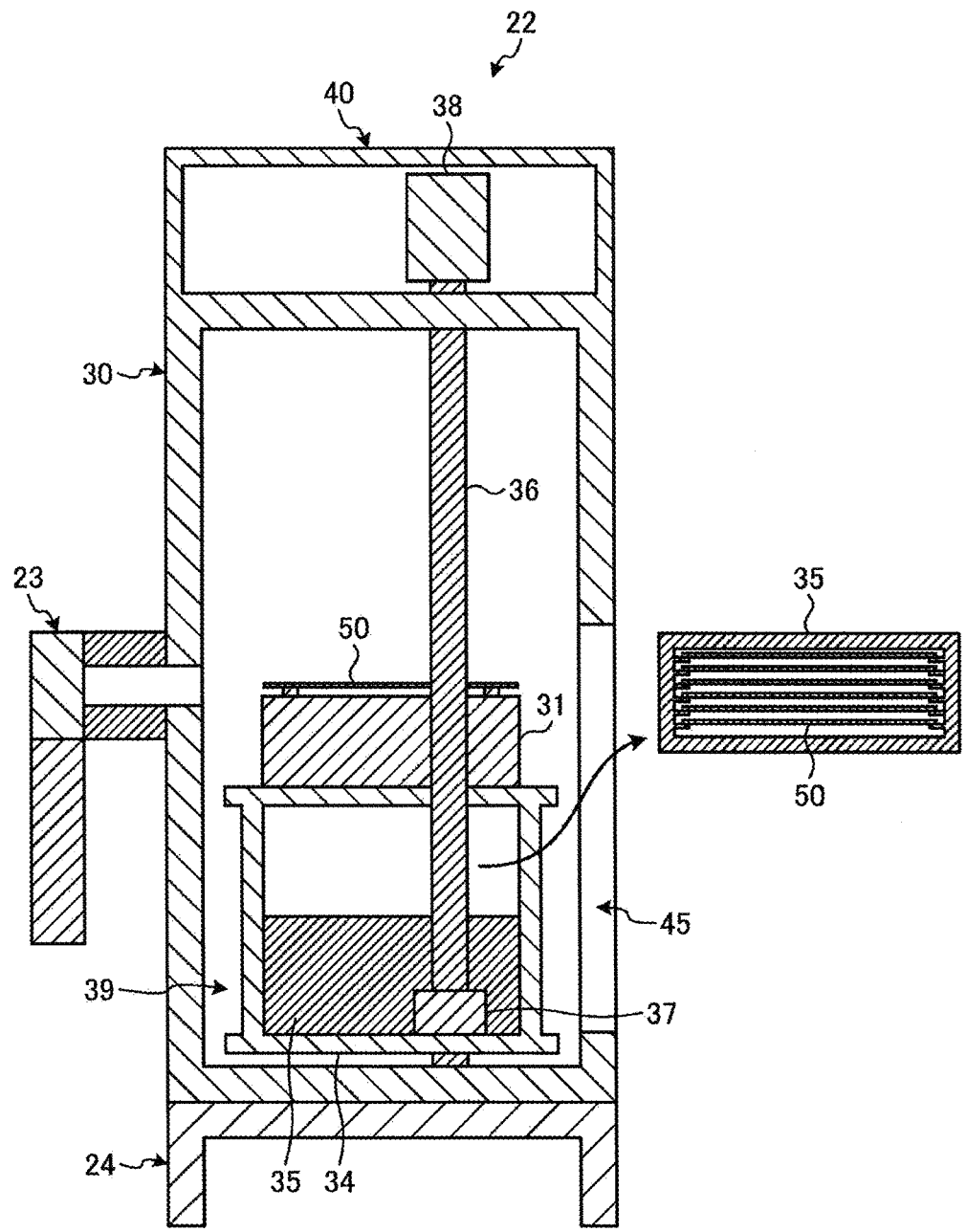
FIG. 4 is a cross-sectional side view showing an example of extracting a cassette from the storage module.

FIG. 4 is a cross-sectional side view showing an example of extracting the cassette from the storage module 22. As shown in FIG. 4, in the case of replacing the edge ring(s) 50 placed in the cassette 35, the storage 39 is moved to the bottom surface side of the chamber 30 in a state where the gate valve 23 is closed. Next, the door 42 is opened and the cassette 35 is extracted from an opening 45. Then, a new cassette 35 where the edge ring(s) 50 to be replaced is stored is loaded into the case 34 through the opening 45, and the door 42 is closed.

Figure 5:
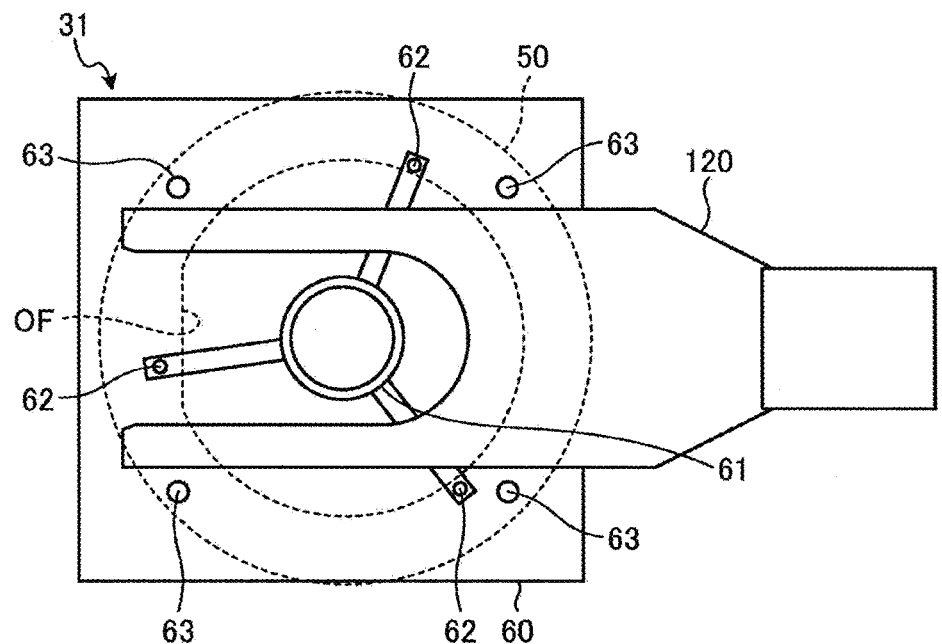
FIG. 5 shows an example of the relationship between an edge ring and a fork on a stage.
Figure 6:
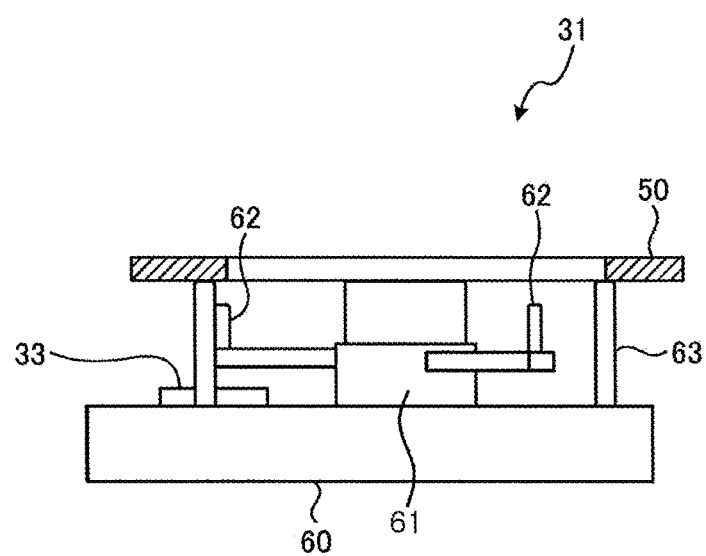
FIG. 6 shows an example of a state in which the edge ring is placed on the stage.

Next, the stage 31 will be described with reference to FIGS. 5 and 6. FIG. 5 shows an example of the relationship between the edge ring 50 and the fork 120 on the stage 31. FIG. 6 shows an example of a state in which the edge ring 50 is placed on the stage 31. The stage 31 includes the light emitting unit 33, a placement base 60, the rotating unit 61, support pads 62, and lift pins 63.

The light emitting unit 33 is disposed to face the line sensor 32. The light emitting unit 33 is, for example, an LED, a semiconductor laser, or the like. For example, when the orientation flat (OF) of the edge ring 50 is located at the position shown in FIG. 5, the amount of light emitted from the light emitting unit 33 changes, so that the orientation flat can be detected. The rotating unit 61 is disposed on the placement base 60. The support pads 62 are respectively disposed at tip ends of three arms provided at the rotating unit 61 to support the edge ring 50 during rotation. The rotating unit 61 is rotated by a driving mechanism (not shown) provided in the placement base 60. The support pads 62 with the arms rotate as the rotating unit 61 rotates. There are, e.g., four lift pins 63 that are vertically moved by the driving mechanism (not shown) provided in the placement base 60. In other words, the rotating unit 61 is disposed directly below the support pads 62 serving as the substrate support on which the edge ring 50 is placed and rotates the support pads 62. The rotating unit 61, the support pads 62, and the lift pins 63 are disposed at positions where they do not interfere with the fork 120 when the fork 120 having the edge ring 50 thereon is located above the stage 31.

<Transfer Method>

Figure 7:
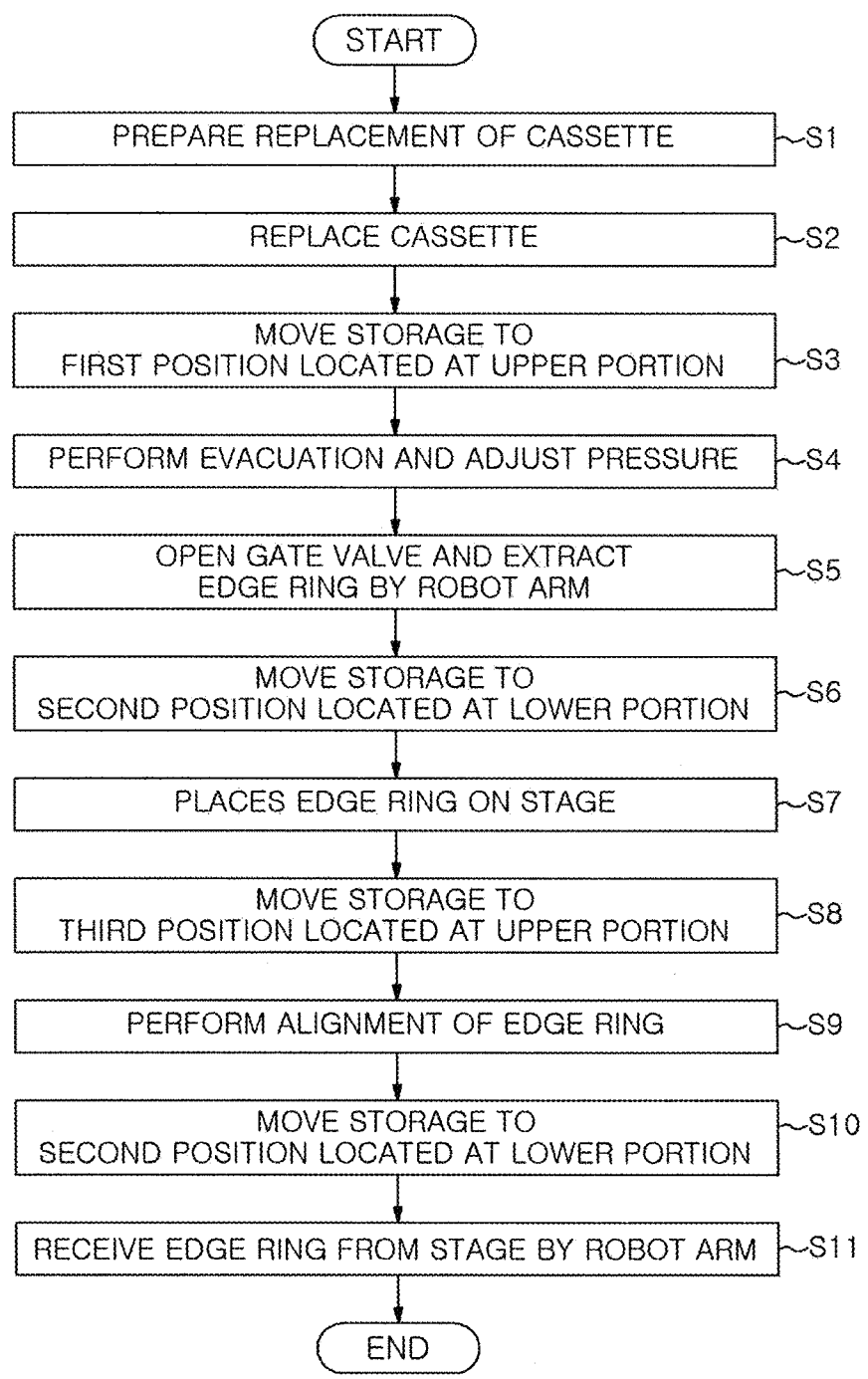
FIG. 7 is a flowchart showing an example of a transfer process in the first embodiment.

Next, a transfer method according to the first embodiment will be described. FIG. 7 is a flowchart showing an example of a transfer process in the first embodiment. FIG. 7 describes processes from the installation of the cassette 35 to the receiving of the aligned edge ring 50 using the robot arm 12b.

First, in an initial state, the gate valve 23 and the door 42 of the storage module 22 are closed, and the pressure in the chamber 30 is adjusted by $N_2$ gas. The controller 100 prepares replacement of the cassette 35 (step S1). Specifically, the controller 100 moves the storage 39 to a lowest position in the chamber 30. The controller 100 stops the supply of $N_2$ gas to the chamber 30, evacuates the chamber 30, and introduces the atmosphere into the chamber 30. Then, the controller 100 turns off a power of a driving system to unlock the door 42.

An operator opens the door 42 and replaces the cassette 35. When the door 42 is closed and a predetermined manipulation is performed by the operator, the controller 100 determines that the replacement of the cassette 35 is completed (step S2).

When the replacement of the cassette 35 is completed, the controller 100 locks the door 42 and moves the storage 39 to a first position located at an upper portion of the chamber 30 (step S3). For example, the controller 100 moves the cassette 35 in the storage 39 to the first position that is, for example, a position facing the gate valve 23. While the storage 39 is moved, the controller 100 detects the presence of the cassette 35 in the storage 39 and further detects the number of edge rings 50 using the sheet quantity detection sensor 44. Here, the sheet quantity detection sensor 44 may also detect the presence of the cassette 35, or a detection micro-switch may be provided in the case 34 to detect the presence of the cassette 35. Further, a sensor may be provided in the case 34 to detect the protrusion of the edge ring 50 from the cassette 35.

When the storage 39 is moved up to the first position located at the upper portion of the chamber 30, the controller 100 evacuates the chamber 30 and introduces $N_2$ gas to adjust a pressure therein (step S4).

The controller 100 opens the gate valve 23 and inserts the fork 120 of the robot arm 12b into the chamber 30. The robot arm 12b receives the edge ring 50 from the cassette 35 using the fork 120 and is temporarily retreated to the VTM 11b (step S5). The controller 100 may close the gate valve 23 after the robot arm 12b receiving the edge ring 50 is retreated to the VTM 11b.

Figure 8:
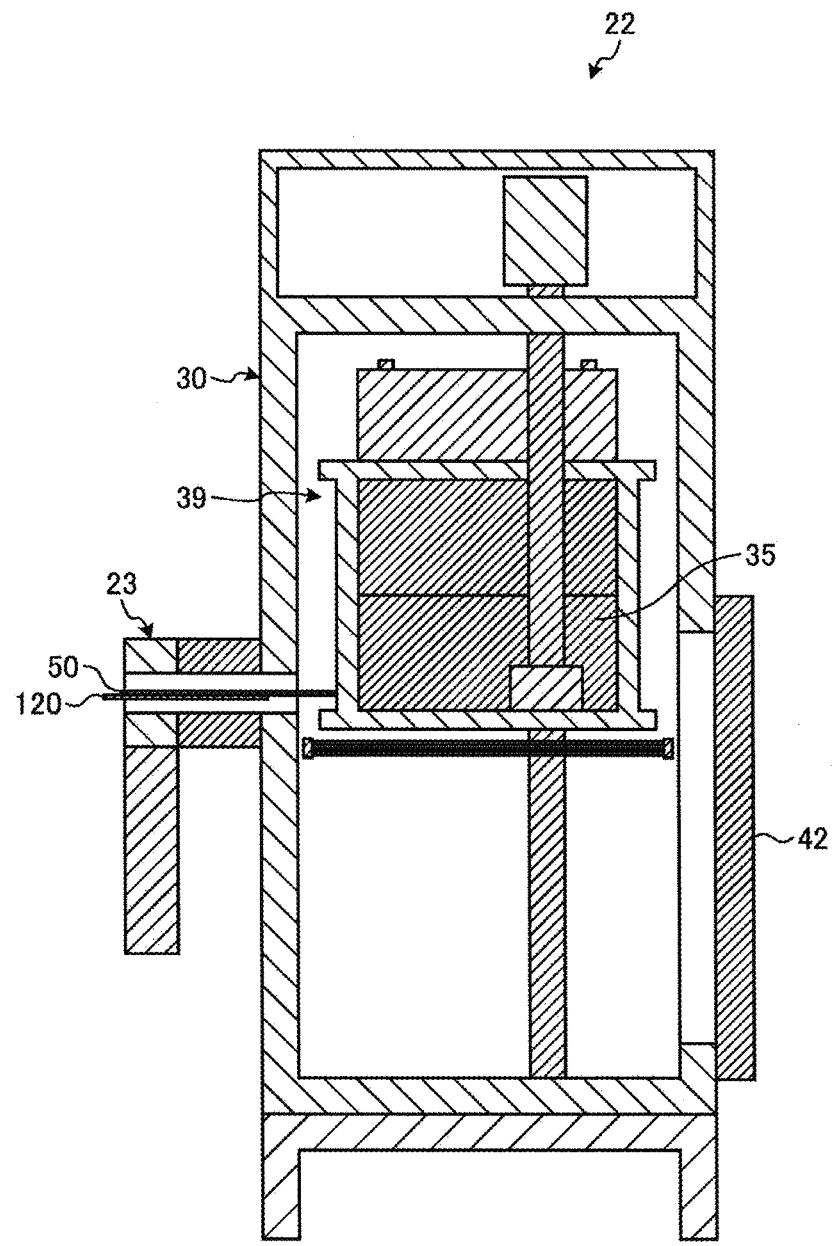
FIG. 8 shows an example of a state in which the fork receives the edge ring from the cassette.

FIG. 8 shows an example of a state in which the fork 120 receives the edge ring 50 from the cassette 35. FIG. 8 shows a state in which the edge ring 50 is received by the fork 120 in step S5. In the example of FIG. 8, the movement of the storage 39 is stopped at the first position where the edge ring 50 can be received from a lower cassette 35 between the cassettes 35 stacked in two stages in the case 34. Further, in FIG. 8, the fork 120 and the edge ring 50 are passing through the gate valve 23 to retreat to the VTM 11b. The first position is variable in the vertical direction depending on the position of the edge ring 50 in the cassette 35.

Referring back to FIG. 7, when the fork 120 and the edge ring 50 are retreated to the VTM 11b, the controller 100 moves the storage 39 to a second position located at a lower portion of the chamber 30 (step S6). For example, the controller 100 moves the storage 39 to the second position that is, for example, a position where the substrate supporting surface of the stage 31 faces the gate valve 23. In a case where the gate valve 23 is being closed, the controller 100 opens the gate valve 23 after the storage 39 is moved to the second position.

When the storage 39 is moved up to the second position, the controller 100 inserts the fork 120 and the edge ring 50 retreated to the VTM 11b into the chamber 30. The robot arm 12b places the edge ring 50 on the fork 120 on the stage 31 (step S7).

Figure 9:
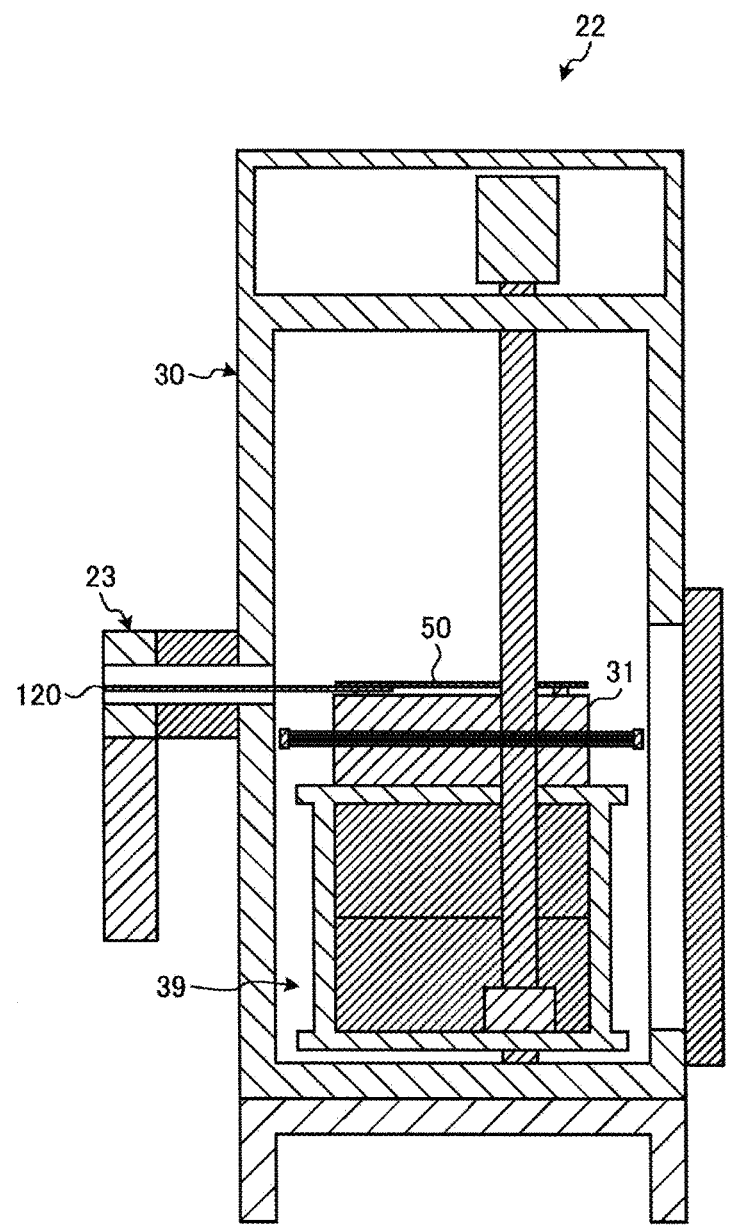
FIG. 9 shows an example of a state in which the fork places the edge ring on the stage.

FIG. 9 shows an example of a state in which the fork 120 places the edge ring 50 on the stage 31. FIG. 9 shows a state in which the edge ring 50 on the fork 120 is placed on the stage 31 in step S7. In the example of FIG. 9, the fork 120 is retreating to the VTM 11b in a state where the edge ring 50 is placed on the stage 31.

Referring back to FIG. 7, the controller 100 moves the storage 39 to a third position located at an upper portion of the chamber 30 after the fork 120 of the robot arm 12b is retreated to the VTM 11b (step S8). The third position is an example of an alignment position and may be the position shown in FIG. 2, for example. The controller 100 may close the gate valve 23 after the fork 120 is retreated to the VTM 11b.

At the third position, the controller 100 performs the positional alignment of the edge ring 50 by rotating the stage 31 while measuring the amount of light emitted from the light emitting unit 33 using the line sensor 32 (step S9). In other words, the controller 100 rotates the edge ring 50 in a predetermined direction based on the orientation of the edge ring 50 detected by the line sensor 32. When the positional alignment of the edge ring 50 is completed, the controller 100 moves the storage 39 to the second position located at the lower portion of the chamber (step S10). In a case where the gate valve 23 is being closed, the controller 100 opens the gate valve 23 after the storage 39 is moved to the second position.

When the storage 39 moves to the second position, the controller 100 inserts the fork 120 retreated to the VTM 11b into the chamber 30. The robot arm 12b receives the edge ring 50 from the stage 31 using the fork 120 (step S11). The controller 100 closes the gate valve 23 and transfers the edge ring received by the robot arm 12b to a predetermined PM 13. In this manner, it is possible to perform the positional alignment and the transfer of the consumable member such as the edge ring 50 in the storage module 22 having a reduced footprint.

Second Embodiment

In the first embodiment, the rotating unit is disposed in the stage 31 to perform the positional alignment by rotating the edge ring 50. However, a placement base to which the substrate support, the storage unit, and the elevating unit are fixed may be rotated. Such an embodiment will be described as a second embodiment. Like reference numerals will be given to like parts of the first embodiment, and the description of redundant components and operations thereof will be omitted.

<Configuration of Storage Module 22a>

Figure 10:
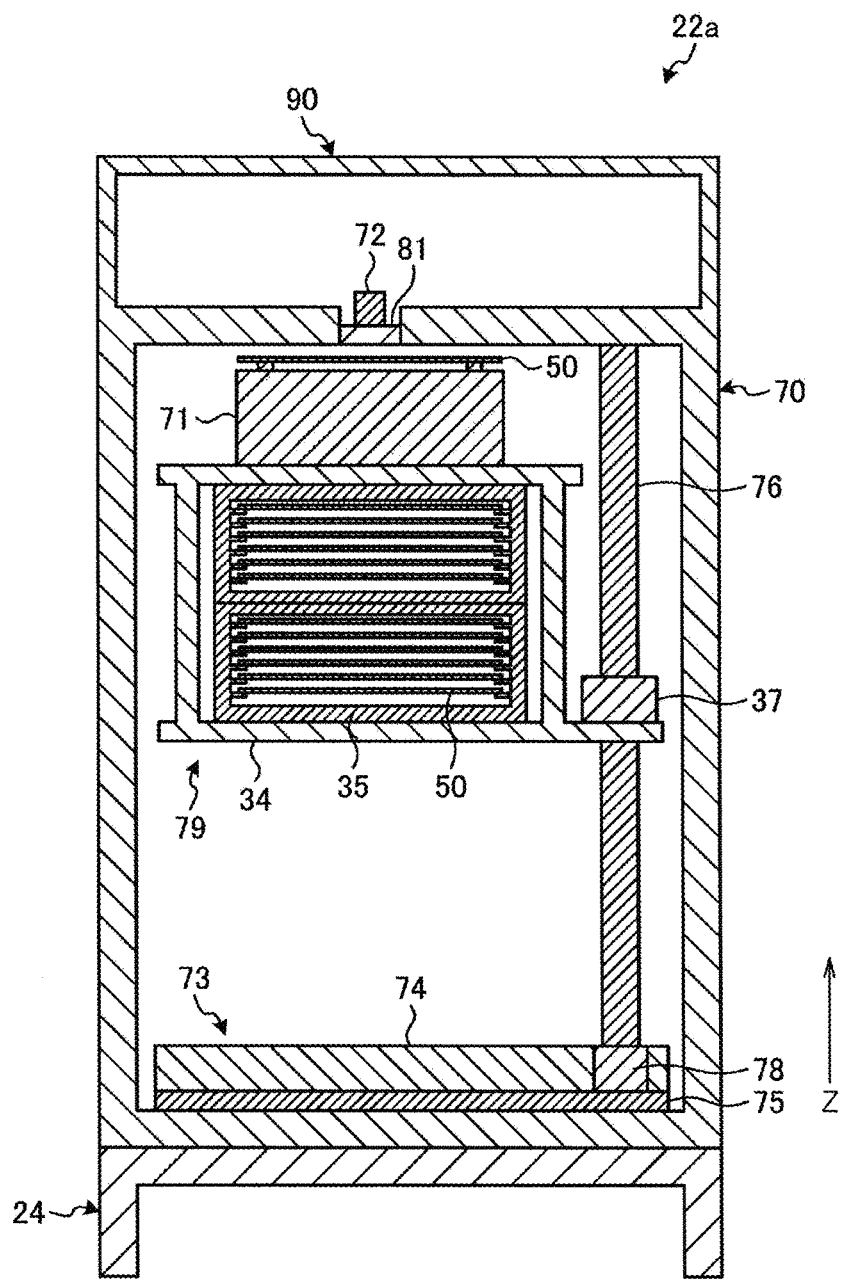
FIG. 10 is a cross-sectional front view showing an example of a storage module according to a second embodiment.

FIG. 10 is a cross-sectional front view showing an example of a storage module 22a according to the second embodiment. The storage module 22a shown in FIG. 10 includes a chamber 70 and a machine room 90, instead of the chamber 30 and the machine room 40 of the storage module 22 of the first embodiment. The storage module 22a further includes a stage 71, an image sensor 72, a ball screw 76, a motor 78, and a storage 79, instead of the stage 31, the line sensor 32, the ball screw 36, the motor 38, and the storage 39. The storage module 22a further includes a placement base 73 provided with the ball screw 76 and the motor 78 on a bottom surface of the chamber 70. Further, the storage 79 has the stage 71 and the case 34.

The stage 71 is an example of the substrate support and is fixed to the case 34. Unlike the stage 31 of the first embodiment, the stage 71 is not rotated by itself. The image sensor 72 is installed in the machine room 90 to capture an image of the edge ring 50 placed on the stage 71 through a window 81 made of quartz or the like. The image sensor 72 outputs the captured image to the controller 100. The controller 100 detects the orientation flat of the edge ring 50 based on the captured image. The image sensor 72 is, for example, a camera using a sensor such as a CCD, a CMOS, or the like.

The placement base 73 has an upper base 74 and a lower base 75. The upper base 74 is provided with the motor 78 that is connected to the ball screw 76. The upper base 74 is rotatable in the θ direction on the lower base 75. The lower base 75 is fixed to the bottom surface of the chamber 70, and the upper base 74 is rotated by a built-in motor (not shown). In other words, the placement base 73 is an example of the rotating unit. The ball screw 76 extends from the upper base 74 to the upper surface of the chamber 70 and has an upper portion that is not fixed so as to be movable in the chamber 70. The upper portion of the ball screw 76 may be movable along a guide rail (not shown) disposed on the upper surface of the chamber 70. The ball screw 76 can move the storage 79 in the vertical direction (Z-axis direction) through the guide 37 while being rotated by the motor 78. The ball screw 76 and the motor 78 are examples of the elevating unit.

In the storage module 22a, in order to perform the positional alignment of the edge ring 50 placed on the stage 71, the stage 71 is rotated by rotating the upper base 74. Accordingly, as in the first embodiment, it is possible to perform the positional alignment and the transfer of the consumable member such as the edge ring 50 in the storage module 22a having a reduced footprint.

In accordance with the above-described embodiments, each of the storage modules 22 and 22a includes the substrate support, the sensor, the rotating unit, the storage unit, and the elevating unit. The consumable member (the edge ring 50) is placed on the substrate support (the stage 31 or 71). The sensor (the line sensor 32 or the image sensor 72) detects the orientation of the consumable member. The rotating unit (the stage 31 or the placement base 73) rotates the consumable member in a predetermined direction based on the orientation of the consumable member detected by the sensor. The storage unit (the case 34 and the cassette 35) is disposed under the substrate support and stores the consumable member(s). The elevating unit (the ball screw 36 or 76, and the motor 38 or 78) vertically moves the storage unit. Accordingly, the substrate support, the rotating unit, and the storage unit can be integrated, which makes it possible to reduce the footprint of the storage module.

In accordance with the first embodiment, the rotating unit is disposed directly below the substrate support and rotates the substrate support. Accordingly, the position of the consumable member such as the edge ring 50 can be aligned.

Further, in accordance with the first embodiment, the elevating unit vertically moves the substrate support, the rotating unit, and the storage unit. Accordingly, the edge ring stored in the storage unit can be moved to the substrate support.

In accordance with the second embodiment, the rotating unit rotates the placement base to which the substrate support, the storage unit, and the elevating unit are fixed. Accordingly, the position of the consumable member such as the edge ring 50 can be aligned.

Further, in accordance with the above-described embodiments, the consumable member is at least one selected among the edge ring, the cover ring and the upper electrode. Accordingly, each consumable member to be replaced can be stored, aligned, and transferred.

Further, in accordance with the first embodiment, the sensor is a line sensor. Accordingly, the orientation of the consumable member such as the edge ring 50 can be detected.

Further, in accordance with the second embodiment, the sensor is an image sensor. Accordingly, the orientation of the consumable member such as the edge ring 50 can be detected.

Further, in accordance with the above-described embodiments, the elevating unit is a ball screw. Accordingly, the heights of the substrate support and the storage unit can be controlled with high accuracy.

Further, in accordance with the first embodiment, the controller 100 executes a method of transferring the consumable member (the edge ring 50) in the storage module 22. The controller 100 executes a step of moving the storage unit (the cassette 35) where the consumable members are stored to the position facing the gate valve 23 in a state where the door 42 and the gate valve 23 of the storage module 22 are closed. Then, the controller 100 executes a step of evacuating the storage module 22 (chamber 30) and adjusting a pressure therein using a purge gas. Then, the controller 100 executes a step of opening the gate valve 23 and receiving the consumable member from the storage unit by the vacuum transfer robot (the robot arm 12b). Then, the controller 100 executes a step of moving the substrate support (the stage 31) disposed on or above the storage unit to the position facing the gate valve 23. Then, the controller 100 executes a step of placing the consumable member received by the vacuum transfer robot on the substrate support. The, the controller 100 executes a step of moving the substrate support to the alignment position and rotating the consumable member to perform the positional alignment. Then, the controller 100 executes a step of moving the substrate support to the position facing the gate valve. Then, the controller 100 executes a step of receiving the consumable member from the substrate support by the vacuum transfer robot. Accordingly, it is possible to perform the positional alignment and the transfer of the consumable member such as the edge ring 50 in the storage module 22 having a reduced footprint.

The presently disclosed embodiments are considered in all respect to be illustrative and not restrictive. The above-described embodiments can be embodied in various forms.

Further, the above-described embodiments may be omitted, replaced, or changed in various forms without departing from the scope of the appended claims and the gist thereof.

Although the stage 71 is disposed in the storage 79 in the second embodiment, the present disclosure is not limited thereto. For example, lift pins may be disposed at an upper portion of the case 34 of the storage 79, and the edge ring 50 may be placed on the case 34 and rotate together with the upper base 74. Further, the upper surfaces of the case 34 and the cassette 35 may be made of transparent members, and the orientation of the edge ring 50 accommodated in the uppermost portion of the cassette 35 may be rotated by the rotation of the upper base 74.

Although the stages 31 and 71 are fixed to the case 34 in the above-described embodiments, the present disclosure is not limited thereto. For example, the stages 31 and 71 and the case 34 may be separated and individually moved up and down.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A storage module comprising:
   a chamber:
   a support disposed in the chamber;
   a sensor configured to detect an orientation of a consumable structure on the support;
   a driver configured to rotate the support based on the orientation of the consumable structure detected by the sensor;
   a storage disposed below the support in the chamber and configured to store the consumable structure; and
   an elevator configured to vertically move the storage in the chamber.

2. The storage module of claim 1, wherein
   the consumable structure is an annular structure,
   the support includes a rotating base and a plurality of ring supporters outwardly extending from the rotating base, and
   the plurality of ring supporters are configured to support the annular structure.

3. The storage module of claim 2, wherein the annular structure is an edge ring, or a cover ring.

4. The storage module of claim 3, wherein the sensor is a line sensor.

5. The storage module of claim 3, wherein the sensor is an image sensor.

6. The storage module of claim 5, wherein the elevator is a ball screw.

7. The storage module of claim 1, wherein the elevator is configured to vertically move the storage together with the support.

8. The storage module of claim 1, further comprising a placement base to which the support, the storage, and the elevator are fixed, wherein
   the driver rotates the placement base.

9. The storage module of claim 1, wherein the consumable structure is an edge ring.

10. The storage module of claim 1, wherein the consumable structure is a cover ring.

11. The storage module of claim 1, wherein the consumable structure is an upper electrode.

12. The storage module of claim 1, wherein the sensor is a line sensor.

13. The storage module of claim 1, wherein the sensor is an image sensor.

14. The storage module of claim 1, wherein the elevator is a ball screw.

15. A substrate processing system comprising:
a vacuum transfer module;
a substrate processing module connected to the vacuum transfer module; and
a storage module connected to the vacuum transfer module,
wherein the storage module includes:
a chamber:
a support disposed in the chamber;
a sensor configured to detect an orientation of a consumable structure on the support, the consumable structure being used in the substrate processing module;
a driver configured to rotate the support based on the orientation of the consumable structure detected by the sensor;
a storage disposed below the support in the chamber and configured to store the consumable structure; and
an elevator configured to vertically move the storage in the chamber.

16. The substrate processing system of claim 15, wherein the consumable structure is an annular structure,
the support includes a rotating base and a plurality of ring supporting structures outwardly extending from the rotating base, and
the plurality of ring supporting structures are configured to support the annular structure.

17. The substrate processing system of claim 16, wherein the annular structure is an edge ring or a cover ring.

18. The substrate processing system of claim 15, wherein the elevator is configured to vertically move the storage together with the support.

19. The substrate processing system of claim 15, further comprising a placement base to which the support, the storage, and the elevator are fixed, wherein the driver rotates the placement base.

* * * * *